United States Patent [19]

Hermann

[11] Patent Number: 4,660,123
[45] Date of Patent: Apr. 21, 1987

[54] APPLIANCE FOR RELEASABLE FASTENING OF A COOLING MEMBER TO AN INTEGRATED MODULE

[75] Inventor: Adam Hermann, Munich, Fed. Rep. of Germany

[73] Assignee: Siemens Aktiengesellschaft, Berlin and Munich, Fed. Rep. of Germany

[21] Appl. No.: 654,154

[22] Filed: Sep. 25, 1984

[30] Foreign Application Priority Data

Sep. 29, 1983 [DE] Fed. Rep. of Germany ....... 3335365

[51] Int. Cl.$^4$ ............................................. H05K 7/20
[52] U.S. Cl. .................... 361/386; 165/80.3; 165/185; 174/16 HS; 357/81
[58] Field of Search ............. 165/80 B, 80 D, 185; 174/16 HS; 357/81; 361/383, 386-388

[56] References Cited

U.S. PATENT DOCUMENTS

| 3,617,980 | 11/1972 | Alkire et al. | 357/81 |
|---|---|---|---|
| 3,786,317 | 1/1973 | Thierfelder | 357/81 |
| 4,169,642 | 10/1979 | Mouissie | 339/17 F |
| 4,203,488 | 5/1980 | Johnson et al. | 361/383 |
| 4,235,285 | 11/1980 | Johnson et al. | 174/16 HS |
| 4,408,220 | 10/1983 | Calabro | 361/386 |

FOREIGN PATENT DOCUMENTS 902219 8/1962 United Kingdom .

OTHER PUBLICATIONS

Almquist et al, "Spring-Clip Mounted Extruded Aluminum Heat Sink", IBM Technical Disclosure Bulletin, vol. 23, No. 12, 5/81, p. 5303.

Primary Examiner—A. D. Pellinen
Assistant Examiner—Gregory D. Thompson
Attorney, Agent, or Firm—Hill, Van Santen, Steadman & Simpson

[57] ABSTRACT

A spring clip, bent into a H-shaped and comprising a centrally-disposed opening corresponding to the core diameter of the cooling member, the spring clip comprising a parting line for a single-sided spreading upon introduction between the cooling ribs of the cooling member, spreader brackets projecting laterally up and T-shaped projections which are disposed at the ends of downwardly extending legs and which engage into assigned recesses of the integrated module or its plug base.

10 Claims, 6 Drawing Figures

APPLIANCE FOR RELEASABLE FASTENING OF A COOLING MEMBER TO AN INTEGRATED MODULE

BACKGROUND OF THE INVENTION

1. Field of the Invention

The present invention relates to an appliance for releasably fastening the cooling member to an integrated module and, in particular, relates to such a module wherein the terminals of the module are disposed on the underside and extend up to the edge of the module.

2. Description of the Prior Art

The method of screwing or the method of pinching by way of a resilient design of a cooling member itself is frequently applied for fastening cooling members to individual semiconductors. These methods, however, are not suited to fastening cooling members to integrated circuits, particularly to integrated circuits having a multitude of terminals disposed on the underside, which terminals usually extend up to the edge of the module. It is known, for this purpose, to groove the cooling member directly to the top side of the integrated module. The disadvantage of this method is that the cooling member cannot be non-destructively separated from the module. It has been disclosed, for the releasable fastening of a cooling member to an integrated module, to press the cooling member onto the integrated module from the top with the assistance of a spring clip. Such known spring clips consist of sheet spring steel and therefore create the hazard of a short circuit of the terminals disposed on the underside of the module and extending up to the edge of the module. In order to avoid this hazard, insulator parts are additionally disposed between the spring clip and the integrated module. This, in turn, has the disadvantage that insulator parts must also be manufactured in addition to the spring clip and then attached and that, further, the spring clip takes up additional lateral space, this being extremely undesirable in light of the high packing density of modern electronic systems. Since the known spring clip for releasably fastening a cooling member to an integrated module press the cooling member onto the module from the top, additional spaces also wasted by the spring clip in the height and the cooling member must be made correspondingly smaller given a prescribed overall height; this can lead to the fact that the cooling capacity is no longer adequate.

SUMMARY OF THE INVENTION

It is therefore the object of the invention to provide an appliance which avoids the disadvantages of the aforementioned known means and which also requires no special tools when mounting or dismounting the cooling member.

The above object is achieved, according to the present invention, with a spring clip that is bent into a H-shaped and which comprises a centrally-disposed opening roughly corresponding to the core diameter of the cooling member for the purpose of encompassing the cooling member between the cooling ribs, and is further achieved by at least one parting line for a single-sided spreading of the spring clip upon insertion between the cooling ribs of the cooling member, as well as by way of spreader brackets which project laterally up. Further, the spring clip bent into a H-shaped also comprises two pair of T-shaped projections disposed at the leg ends of the spring clip, the projections engaging flatly into correspondingly disposed, rectangular recesses at the side of the integrated module or, respectively, of the plug base for the module.

BRIEF DESCRIPTION OF THE DRAWINGS

Other objects, features and advantage of the invention, its organization, construction and operation will be best understood from the following detailed description taken in conjunction with the accompanying drawings, on which.

DESCRIPTION OF THE PREFERRED EMBODIMENTS

Figure 1:
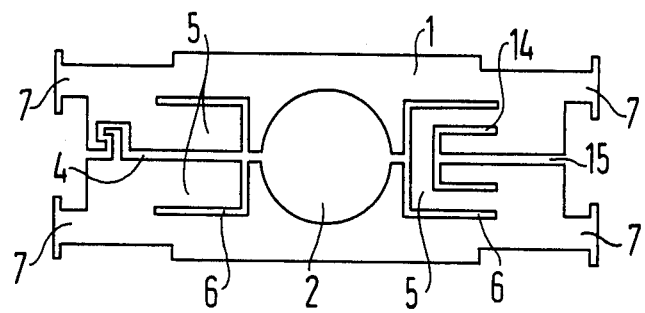
FIG. 1 is a plan development view of a spring clip constructed in accordance with the present invention.
Figure 4:
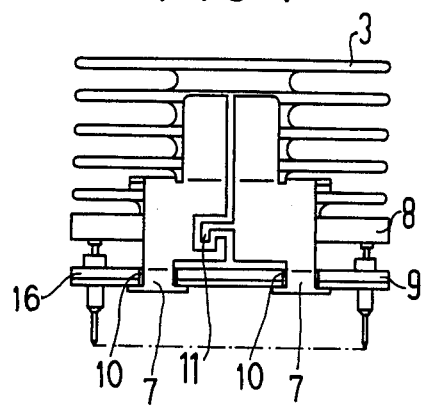
FIGS. 4 and 5 are different side views of the spring clip shown mounted on a cooling member for an integrated module together with a plug base.
Figure 5:
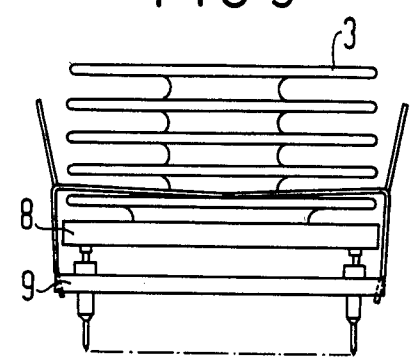

Referring to FIG. 1, a development of a spring clip is illustrated at 1. It can be seen that the spring clip essentially has a rectangular shape and comprises an opening 2 disposed roughly centrally and roughly corresponding to the core diameter of a cooling member 3 (FIGS. 4 and 5). A parting line 4 is also provided, this enabling the spring clip to be spread apart when it is introduced between the cooling ribs of the cooling member 3. U-shaped slots 6 are also located in the spring clip 1 and serve the purpose of forming so-called spreader brackets 5 after the spring clip has been bent into its final shape, as illustrated in FIG. 2.

Figure 2:
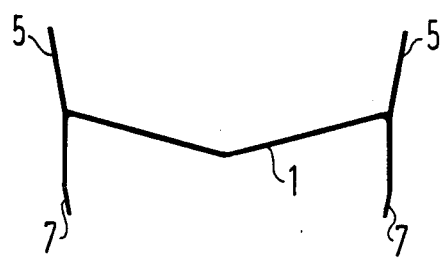
FIGS. 2 and 3 are side views of the bent and finished spring clip.

Two pair of T-shaped projections 7 each projection including a cross bar on a respective leg are disposed at the ends of the H-shaped spring clip 1 and are bent only slightly in the direction toward the integrated module 8 or, respectively, the plug base 9, as illustrated in FIGS. 2 and 5. When the cooling member 3 is clamped to the integrated module 8, these T-shaped projections 7 engage into correspondingly arranged, rectangular recesses 10 at the side of the plug base 9 for the integrated module, as may be seen in FIG. 6.

Figure 3:
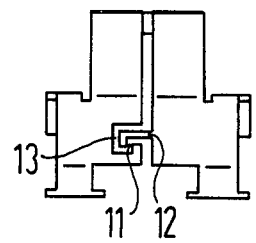

According to an advantageous feature of the invention, a locking structure 11 for locking the spring clip is provided at the divisible side of the spring clip 1. The locking structure 11 advantageously comprises an L-shaped projection 12 (FIG. 3) disposed at the one leg of the divisible side of the spring clip 1 and an L-shaped recess 13 disposed at the other leg of the divisible side of the spring clip, the elements 12 and 13 interlocking after the spring clip has been inserted between the ribs of the cooling member 3 and thus holding the divisible side of the spring clip 1 closed.

In order, on the one hand, to achieve adequate stability of the spring clip 1 but, on the other hand, to facilitate the spreading of the spring clip upon introduction between the ribs of the cooling member, a U-shaped slot 14 extending parallel to the edges of the spreader bracket 5 is provided in accordance with another feature of the invention in the spreader bracket 5 of the non-divisible side of the spring clip 1. This U-shaped slot communicates with a straight line slot 15 which extends centrally from the corresponding end of the spring clip to the U-shaped slot 14. Movement of the spreader brackets 5 away from one another facilitates spreading of the central opening 2 to facilitate introduction of the bracket portions adjacent the opening 2 between the ribs, while movement of the spreader brackets 5 toward one another facilitate movement of the T-shaped projection 7 outwardly to clear the edges of the base 9 and facilitate mounting and dismounting of the spring clip 1.

In order to achieve good contact pressure of the cooling member 3 against the integrated module 8, the central opening portion of the H-shaped spring clip 1 is bent down in the direction toward the integrated module 8, such as shown here to have a V shape.

Figure 6:
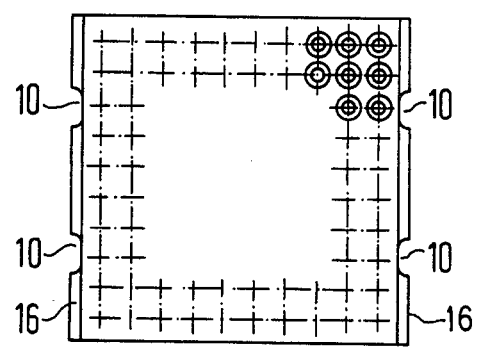
FIG. 6 is a plan view of the plug base for the integrated module.

Visible, finally, with reference to FIG. 6, is that the upper edges 16 of those sides of the plug base 9 in which the recesses 10 receiving the T-shaped projections of the spring clip 1 are provided are slanted toward the side of the cooling member. These diagonals facilitate the introduction of the T-shaped projections 7 into the allocated recesses 10.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An appliance releasably fastening a cooling member to an integrated circuit module mounted on a plug base, the cooling member having a core and cooling fins extending from the core, the appliance comprising:
   an H-shaped spring clip including
      a first leg section including first legs for releasably engaging the plug base,
      a second leg section including second legs for releasably engaging the plug base,
      an intermediate section connecting said first and second leg sections and including a central aperture for receiving the core of the cooling member, and intermediate section portions adjacent said central aperture for receipt between a pair of the cooling fins and a parting slot extending from the central aperture to one end of said spring clip to facilitate spreading of the spring clip over the cooling member, and
      a plurality of spreader brackets extending from and in the opposite direction of said first and second legs effecting releasable engagement of said first and second legs upon movement of said spreader brackets towards one another.

2. The appliance of claim 1, wherein:
   a pair of U-shaped slots in said spring clip define said spreader brackets.

3. The appliance of claim 1, and further comprising:
   T-shaped distal ends on said first and second legs engaging the plug base.

4. The appliance of claim 3, wherein said parting slot extends between said first legs, and further comprising:
   locking means on said first legs locking said first legs against separation from one another after mounting.

5. The appliance of claim 4, wherein:
   said locking means comprises an L-shaped projection on one of said first legs and an L-shaped recess on another of said first legs receiving said L-shaped projection.

6. The appliance of claim 1, wherein:
   a pair of parallel U-shaped slots define one of said spreader brackets; and
   a further slot extends from one of said U-shaped slots to the respective end of said clip to define a separation between said second legs.

7. The appliance of claim 6, wherein:
   said intermediate section comprises a downwardly directed V-shape.

8. The appliance of claim 3, wherein:
   said T-shaped distal ends of said first and second legs extend downwardly from said intermediate section at a convergent angle towards one another.

9. In combination, an integrated circuit module and a spring clip releasably fastening a cooling member to said integrated circuit module, the cooling member having a plurality of spaced fins extending from a core, and a base, said combination comprising:
   a plurality of spaced edge rectangular recesses on said base,
   said spring clip comprising an intermediate section and first and second leg sections depending from said intermediate section at a convergent angle towards one another,
   a central aperture in said intermediate section flanked by a pair of intermediate portions, said central aperture receiving the core and said intermediate portions being received between adjacent cooling fins,
   each of said leg sections including a pair of legs each comprising a T-shaped distal end, each of said distal ends including a cross bar on a respective leg, with each leg received in a respective recess and the cross bar engaging against said base adjacent a respective recess,
   spreader brackets extending from said first and second leg sections in directions opposite said distal ends releasably engaging said distal ends with said base upon movement of said spreader brackets towards the core, and
   a parting slot extending from said central aperture to one end of said spring clip to facilitate mounting of said spring clip over the cooling member.

10. The combination of claim 9, wherein:
    said base comprises surfaces in the rectangular recesses which are beveled toward the center of the base.

* * * * *